(12) United States Patent
Watanabe et al.

(10) Patent No.: US 7,887,692 B2
(45) Date of Patent: Feb. 15, 2011

(54) PALLADIUM PLATING SOLUTION

(75) Inventors: Shingo Watanabe, Hiratsuka (JP); Junji Ohnishi, Hiratsuka (JP); Hiroshi Wachi, Hiratsuka (JP); Takayuki Sone, Hiratsuka (JP)

(73) Assignee: Electroplating Engineers of Japan Limited, Tokyo (JP)

(*) Notice: Subject to any disclaimer, the term of this patent is extended or adjusted under 35 U.S.C. 154(b) by 501 days.

(21) Appl. No.: 11/711,516

(22) Filed: Feb. 27, 2007

(65) Prior Publication Data

US 2007/0205109 A1  Sep. 6, 2007

(30) Foreign Application Priority Data

Mar. 3, 2006  (JP)  .............................. 2006-057797
Feb. 7, 2007  (JP)  .............................. 2007-027861

(51) Int. Cl.
  C25D 3/50  (2006.01)
  C25D 3/60  (2006.01)
  C25D 3/56  (2006.01)
  C23C 16/00  (2006.01)

(52) U.S. Cl. .................. 205/265; 205/252; 205/257; 106/1.28

(58) Field of Classification Search .............. 106/1.28; 205/252, 257, 265
See application file for complete search history.

(56) References Cited

U.S. PATENT DOCUMENTS 3,933,602 A * 1/1976 Henzi et al. ................. 205/257
6,183,545 B1 * 2/2001 Okuhama et al. ............ 106/1.18

FOREIGN PATENT DOCUMENTS

| DE | 4201129 A1 | 7/1992 |
| GB | 2089374 A | 6/1982 |
| JP | 06-232311 | 8/1994 |
| JP | 09-008438 | 1/1997 |

OTHER PUBLICATIONS

Peng et al., Determination of Germanium, Palladium and Platinum in Highly Concentrated Solutions of Phosphoric Acid and Ammonium Nitrate by Flow Injection Inductively Coupled Plasma Mass Spectrometry (FI-ICP-MS), Spectrochimica Acta, Part B: Atomic Spectroscopy (no month, 1991), vol. 46B, Nos. 6-7, pp. 1051-1061. Abstract Only.*

* cited by examiner

Primary Examiner—Edna Wong
(74) Attorney, Agent, or Firm—Roberts & Roberts, LLP

(57) ABSTRACT

The invention provides a plating solution capable of forming a palladium plating film which can further improve solder characteristics in surface treatment of a composition made of a nickel plating film, a palladium plating film and a gold plating film on a surface of a conductor formed from a metal such as copper. In a palladium plating solution of the invention containing a soluble palladium salt and an electrically conductive salt having a liquid composition containing germanium, the amount of the soluble palladium salt is 0.1 g/l to 50 g/l in terms of a reduced value of palladium metal, the amount of the electrically conductive salt is 10 g/l to 400 g/l and the amount of the germanium is 0.1 mg/l to 1000 mg/l.

2 Claims, 1 Drawing Sheet

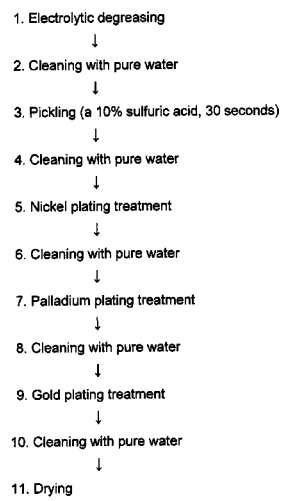

FIG. 1

1. Electrolytic degreasing
   ↓
2. Cleaning with pure water
   ↓
3. Pickling (a 10% sulfuric acid, 30 seconds)
   ↓
4. Cleaning with pure water
   ↓
5. Nickel plating treatment
   ↓
6. Cleaning with pure water
   ↓
7. Palladium plating treatment
   ↓
8. Cleaning with pure water
   ↓
9. Gold plating treatment
   ↓
10. Cleaning with pure water
    ↓
11. Drying

PALLADIUM PLATING SOLUTION

BACKGROUND OF THE INVENTION

1. Field of the Invention

The present invention relates to a palladium plating solution and, more particularly, to a palladium plating film which provides a junction with a junction material, such as a solder.

2. Description of the Related Art

In recent years, as electronic parts and semiconductor parts there have been various things such as a printed circuit board and a package. Examples of what are called packages include a lead frame, a BGA (ball grid array), an LGA (land grid array package), a QFP (quad flat package), a minimold package and the like. To meet requirements for high-density packaging, these packages have been improved day by day to adapt to miniaturization and multi-pin designs and characteristics required of them tend to be increasingly severe.

In such electronic parts and semiconductor parts, solders and bonding wires have hitherto been used as their junction materials, and soldering and wire bonding have been established as junction techniques indispensable for mounting packages on printed circuit boards, such as printed wiring boards.

With respect to the packaging techniques of such electronic parts and the like, in the case of a lead frame, in order to improve the junction characteristics of a wire bonding terminal and a solder bonding terminal, there has been known a technique which involves forming a junction composed of a nickel plating film, a palladium plating film and a gold plating film on a copper surface constituting these terminals (refer to Japanese Patent Application Laid-Open No. 9-8438).

The reason why a palladium plating film is adopted in such junctions is that this palladium plating film can prevent the diffusion of the copper of a base sheet into nickel, thereby ensuring the junction by soldering and wire bonding. However, as a result of the recent progress in miniaturization and high-density packaging techniques for electronic parts and semiconductor parts, characteristics required of this junction have become more and more severe than ever.

For this reason, there has been proposed a technique which involves forming a junction in the outer lead of a lead frame by causing elements such as tellurium and antimony to be contained in this palladium plating film (refer to Japanese Patent Application Laid-Open No. 6-232311). Such a palladium plating film can maintain good solderability even when a junction is subjected to a thermal history to a certain degree.

SUMMARY OF THE INVENTION

However, with the trend toward the miniaturization of packages and high-density packaging designs, the thin-film designs and small-area designs of the junction itself are proceeding and, therefore, a junction capable of realizing a good junction condition even when the junction is subjected to a high-temperature thermal history is required. In particular, in performing junction by soldering, under the present circumstances, there is required, also from the standpoint of manufacturing efficiency, a technique capable of forming a junction having excellent heat resistance which enables good junction to be performed even when the junction is subjected to a high-temperature thermal history.

The present invention has been made against the above-described circumstances, and in a junction which has hitherto been adopted in packages and the like, i.e., a junction having the construction of a nickel plating film, a palladium plating film and a gold plating film on a surface of a conductor formed from a metal such as copper, the invention provides a plating solution capable of forming a palladium plating film which can further improve the junction characteristics of the junction. In particular, in performing junction by soldering, the invention provides a plating solution capable of forming a palladium plating film which becomes a junction having excellent heat resistance.

To solve the above-described problems, the present inventors devoted themselves to repeated researches on a palladium plating solution capable of forming a palladium plating film. As a result, they found out that by adding germanium to a palladium plating solution containing a soluble palladium salt and an electrically conductive salt, the barrier action of the palladium plating film is improved, and have reached the present invention.

A palladium plating solution of the present invention contains a soluble palladium salt and an electrically conductive salt and further contains germanium. The addition of germanium to the palladium plating solution enables a junction having much higher heat resistance than that of a junction formed by a conventional palladium plating film to be formed, thereby enabling excellent junction characteristics to be realized.

It is thought that because the element of germanium is deposited in a palladium plating film which is obtained, the barrier function of a palladium plating film obtained when a junction is formed is maintained even when the junction is subjected to a high-temperature thermal history. It is preferred that the amount of the germanium which is co-deposited in this palladium plating film be 1 ppm to 10000 ppm. If this amount is less than 1 ppm, the action of improving the barrier function decreases. Furthermore, this is because in the composition of a palladium plating solution of the present invention, it is difficult for germanium in amounts exceeding 10000 ppm to be co-deposited in the palladium film.

As the soluble palladium salt of the present invention, it is preferable if amino group-based palladium complex or ammonia-based palladium complex is contained, and more particularly, it is preferable if it is at least one kind selected from the group consisting of palladium chloride, dichloroethylenediamine palladium (II), dichlorodiamine palladium (II), dinitrodiamine palladium (II), tetraamine palladium (II) nitrate, tetraamine palladium (II) sulfate, oxalatodiamine palladium (II), tetraamine palladium (II) oxalate and tetraamine palladium (II) chloride. It is also permissible to combine two or more of these components. The use of these soluble palladium salts enables a palladium plating film to be efficiently deposited.

It is preferred that the electrically conductive salt according to the present invention be at least one kind selected from the group consisting of an ammonium salt, a sodium salt and a potassium salt of hydrochloric acid, nitric acid, sulfuric acid, phosphoric acid, citric acid and the like, and more concretely, it is preferred that at least one kind selected from the group consisting of ammonium chloride, ammonium nitrate, ammonium sulfate, ammonium phosphate and ammonium citrate. Two or more kinds of these salts may be combined. As a result of this, it is possible to impart good electrical conductivity and buffer properties to a plating solution.

Furthermore, in the palladium plating solution of the present invention, it is preferred that the concentration range of the soluble palladium salt be 0.1 g/l to 50 g/l in terms of a reduced value of palladium metal, that the concentration range of the electrically conductive salt be 10 g/l to 400 g/l, and that the concentration range of the germanium be 0.1 mg/l to 1000 mg/l.

In this case, if the amount of the palladium is less than 0.1 g/l, the deposition rate of the plating film decreases and this is undesirable. If the amount of the palladium exceeds 50 g/l, it becomes too large and this results in an increase in ingot cost although there is no change in deposition characteristics. Therefore, this amount is not practicable.

If the amount of the electrically conductive salt is less than 10 g/l, the electrical conductivity of the plating solution decreases and this is undesirable. If the amount of the electrically conductive salt exceeds 400 g/l, the salting out of the electrically conductive salt is apt to occur and this is undesirable.

If the amount of the germanium is less than 0.1 mg/l, the barrier function of the palladium plating film in a junction does not work well. If the amount of the germanium exceeds 1000 mg/l, it becomes difficult for a germanium compound consisting of a soluble germanium salt to dissolve.

When palladium plating treatment is performed by using a palladium plating solution of the present invention, it is preferred that the treatment conditions be such that the liquid temperature is 25 to 70° C., the pH is 6.0 to 10.0 and the current density is 0.10 A/dm$^2$ to 5.00 A/dm$^2$. The critical current density decreases if the liquid temperature is less than 25° C., and the decomposition phenomenon of the plating solution tends to occur if the liquid temperature exceeds 70° C., with the result that this tends to promote damage to an object to be plated. The stability of the plating solution tends to decrease if the pH is less than 6.0 and damage to an object to be plated is promoted if the pH exceeds 10.0. The productivity decreases if the current density is less than 0.10 A/dm$^2$ and this is not practicable, and what is called burn plating occurs if the current density exceeds 5.00 A/dm$^2$. However, it is necessary to change an optimum range of these current density values according to the construction of a plating apparatus and the like.

In the palladium plating solution of the present invention, it is also possible to appropriately add a brightener, a surfactant and the like. For example, saccharin can be used as the brightener. As the surfactant, it is possible to use any of anionic, cationic and nonionic surfactants.

According to the palladium plating solution related to the present invention, in forming a junction composed of a nickel plating film, a palladium plating film and a gold plating film, it is possible to improve the barrier function of the palladium plating film in this junction and it is possible to improve the heat resistance of the junction and to form a junction having excellent solder wettability.

BRIEF DESCRIPTION OF THE DRAWINGS

FIG. 1 is a flowchart of fabrication of a sample for evaluating solder wettability.

DETAILED DESCRIPTION OF THE PREFERRED EMBODIMENTS

Preferred embodiments of the present invention will be described below on the basis of actual examples carried out.

In the embodiments, a junction to a solder is formed by using a palladium plating solution of the present invention, the evaluation of solder wettability is performed, and a description will be given of results of an investigation into the effectiveness of a palladium plating film.

In the evaluation of solder wettability, a Cu alloy-based lead frame on the surface of which a junction was formed by the plating treatment of a nickel plating film, a palladium plating film and a gold plating film in order was used as an evaluation sample. Each of the plating treatment conditions used in forming this junction is described below.

| <Nickel plating treatment> (Target film thickness: 0.7 μm) SULARMEX 100 (made by Electroplating Engineers of Japan Ltd., liquid composition: a plating solution containing nickel sulfamate) | |
|---|---|
| Liquid temperature | 55° C. |
| Current density | 3 A/dm$^2$ |
| <Palladium plating treatment> (Target film thickness: 0.03 μm) | |
| Dichlorodiamminepalladium (on a Pd metal basis) | 4 g/l |
| Ammonia solution | 20 ml/l |
| Ammonium chloride | 100 g/l |
| Germanium oxide (on a Ge metal basis) | 10, 100, 500 mg/l |
| pH | 8.5 |
| Liquid temperature | 55° C. |
| Current density | 0.75 A/dm$^2$ |
| <Gold plating treatment> (Target film thickness: 0.007 μm) POSTFLASH 100 (made by Electroplating Engineers of Japan Ltd., a plating solution containing potassium cyanide) | |
| Liquid temperature | 50° C. |
| Current density | 0.05 A/dm$^2$ |

An evaluation sample for the evaluation of solder wettability was prepared by performing each of the above-described plating treatment on the surface of a lead frame according to the flow of steps shown in FIG. 1.

The first electrolytic degreasing treatment shown in FIG. 1 (EETOREX 12, made by Electroplating Engineers of Japan Ltd., liquid temperature: 60° C., applied voltage: 6 V, immersion time: 30 seconds) was performed as a pretreatment for removing pollutants, oxides and the like on the lead frame surface.

As the evaluation sample, three kinds in all were prepared in which a palladium plating film was formed by changing the amount of added germanium in the plating solution at there levels of 10, 100 and 500 mg/l (Embodiments 1 to 3 in FIG. 1).

TABLE 1

| | Amount of added germanium |
|---|---|
| Embodiment 1 | 10 mg/L |
| Embodiment 2 | 100 mg/L |
| Embodiment 3 | 500 mg/L |

An evaluation sample (a conventional example) was prepared by using a conventional palladium plating solution. In this conventional example, the following palladium plating was performed, and all other conditions, such as the nickel plating treatment, gold plating conditions, flow of steps and the like, were the same as in the case of the evaluation samples of the above-described embodiments.

| <Palladium plating treatment of conventional example> (Target film thickness: 0.03 μm) | |
|---|---|
| Dichlorodiamminepalladium (on a Pd metal basis) | 10 g/l |
| Ammonia solution | 20 ml/l |
| Ammonium chloride | 100 g/l |
| pH | 8.5 |
| Liquid temperature | 55° C. |
| Current density | 0.75 A/dm$^2$ |

Furthermore, to make a comparison, an evaluation sample (a comparative example) was prepared by using a palladium plating solution containing tellurium (Te). In this comparative example, the following palladium plating was performed, and all other conditions, such as the nickel plating treatment, gold plating conditions, flow of steps and the like, were the same as in the case of the evaluation samples of the above-described embodiments. Incidentally, in the palladium plating film of this comparative example, the amount of co-deposited tellurium in the film was 29 ppm.

| <Palladium plating treatment of comparative example> (Target film thickness: 0.03 μm) | |
|---|---|
| Dichlorodiamminepalladium (on a Pd metal basis) | 4 g/l |
| Ammonia solution | 20 ml/l |
| Ammonium chloride | 100 g/l |
| Tellurium | 50 mg/l |
| pH | 8.5 |
| Liquid temperature | 55° C. |
| Current density | 0.75 A/dm$^2$ |

For each of the above-described evaluation samples, a solder wettability evaluation test was carried out. This solder wettability evaluation test is a test in which after the immersion of an evaluation sample in a solder bath, the time required until the force received from the solder bath becomes 0 (zero) is measured and this time is evaluated as solder wettability (what is called a zero cross time (ZCT) test). Concrete conditions are as follows.

<Solder Wettability Evaluation Test Conditions>
Flux: Rosin flux
Solder bath: 63% tin-37% lead, liquid temperature 230±5° C.
Sample immersion rate: 2 mm/second
Sample immersion depth: 2 mm
Number of immersed samples: 1 sample In the above-described solder wettability evaluation, the test was carried out by holding each heat temperature of the samples at 380±5° C. for 1 minute and at 400±5° C. for 30 seconds. Incidentally, for each of the samples, measurements were made three times under the same conditions. The results of the measurements are shown in Table 2 (heating conditions: 380±5° C.) and Table 3 (heating conditions: 400±5° C.).

TABLE 2

| | Zero cross time (seconds) | | |
|---|---|---|---|
| | Minimum value | Maximum value | Average value |
| Embodiment 1 | 0.46 | 0.53 | 0.49 |
| Embodiment 2 | 0.49 | 0.54 | 0.50 |
| Embodiment 3 | 0.41 | 0.51 | 0.46 |
| Conventional Example | 2.09 | 4.03 | 3.06 |
| Comparative Example | 1.43 | 1.46 | 1.44 |

(Heating conditions: 380 ± 5° C., holding for 1 minute)

TABLE 3

| | Zero cross time (seconds) | | |
|---|---|---|---|
| | Minimum value | Maximum value | Average value |
| Embodiment 1 | 0.31 | 0.40 | 0.36 |
| Embodiment 2 | 0.45 | 0.47 | 0.46 |
| Embodiment 3 | 0.35 | 0.46 | 0.38 |
| Conventional Example | 3.72 | 5.00 | 4.36 |
| Comparative Example | 1.41 | 1.54 | 1.47 |

(Heating conditions: 400 ± 5° C., holding for 30 seconds)

Tables 2 and 3 show the maximum time, minimum time and average time of the three measurements in each of the evaluation samples. As is apparent from Tables 2 and 3, it became clear that in each of the evaluation samples of Embodiments 1 to 3, at both of the heating temperatures of 380° C. and 400° C. the zero cross time is short and variations among the measurements are small, and that the evaluation samples show stable solder wettability. That is, it became clear that even when a high-temperature thermal history is added, the wettability by a solder is excellent. On the other hand, in the conventional example, the zero cross time was long and the variations among the measurements were large. In the comparative example, there was observed a tendency that the zero cross time becomes long when a high-temperature thermal history is added.

Subsequently, in the above-described solder wettability evaluation test, some evaluation samples were subjected to heating treatment at higher 430±5° C. for 30 seconds and these samples were investigated. The results are described. The three evaluation samples of Embodiment 2, the conventional example and comparative example were used in this test. The conditions other than the heating conditions are the same as each of the above-described conditions. The results are shown in Table 4.

TABLE 4

| | Zero cross time (seconds) | | |
|---|---|---|---|
| | Minimum value | Maximum value | Average value |
| Embodiment 2 | 0.62 | 0.67 | 0.63 |
| Conventional Example | 5.00 | 5.00 | 5.00 |
| Comparative Example | 5.00 | 5.00 | 5.00 |

(Heating conditions: 430 ± 5° C., holding for 30 seconds)

As shown in Table 4, in the evaluation samples of the conventional example and the comparative example, the zero cross time was not less than 5 seconds in all cases and the solder wettability showed very bad results. On the other hand, in the case of Embodiment 2, the zero cross time was 0.63 seconds on the average and it became clear that the evaluation sample has excellent solder wettability even after the heat treatment at 430° C. From the above-described results of Tables 2 to 4, it became apparent that with the palladium plating film in this embodiment, the junction is stable even when it is subjected to a high-temperature thermal history, with the result that the junction has excellent solder wettability.

This suggests that even in a case where a lead-free solder having a higher melting point than conventional solders and having a high reflow temperature during melting is used, the exfoliation phenomenon and problems such as junction failures do not occur in the junction of this embodiment. A junction having a palladium plating film of this embodiment permits thin-film designs of a palladium plating film and enables costs to be reduced.

Lastly, for the palladium plating film of Embodiment 2, the plating film composition was investigated. As a result, it became clear that germanium is co-deposited in the palladium of the parent phase in an amount of 4000 ppm. Incidentally, for the analysis method adopted, the amount of palladium contained in a prescribed amount of palladium film was measured by an ICP (inductively-coupled plasma) analysis.

What is claimed is:

1. A palladium plating solution consisting essentially of:
    a germanium compound consisting of a soluble germanium salt having a concentration ranging from 1 mg/l to 1000 mg/l in terms of a reduced value of palladium metal;
    a soluble palladium salt comprising one or more of dichloroethylenediamine palladium (II), palladium chloride, dichlorodiamine palladium (II), dinitrodiamine palladium (II), tetraamine palladium (II) nitrate, tetraamine palladium (II) sulfate, oxalatodiamine palladium (II), tetraamine palladium (II) oxalate and tetraamine palladium (II) chloride, said soluble palladium salt having a concentration ranging from 0.1 g/l to 50 g/l in terms of a reduced value of palladium metal; and
    an electrically conductive salt which is at least one selected from the group consisting of an ammonium salt, a sodium salt, and a potassium salt of hydrochloric acid, nitric acid, sulfuric acid, phosphoric acid, and citric acid, said electrically conductive salt having a concentration ranging from 10 g/l to 400 g/l.

2. A method of palladium plating, comprising plating palladium with a plating solution according to claim 1, wherein said plating is performed at a plating solution temperature of 25 to 70° C., a pH of 6.0 to 10.0 and a current density of 0.10 $A/dm^2$ to 5.00 $A/dm^2$.

* * * * *